(12) United States Patent
Posser et al.

(10) Patent No.: US 10,997,352 B1
(45) Date of Patent: May 4, 2021

(54) ROUTING CONGESTION BASED ON LAYER-ASSIGNED NET AND PLACEMENT BLOCKAGE

(71) Applicant: Cadence Design Systems, Inc., San Jose, CA (US)

(72) Inventors: Gracieli Posser, Austin, TX (US); Mehmet Can Yildiz, Austin, TX (US); Wen-Hao Liu, Cedar Park, TX (US); Wing-Kai Chow, Austin, TX (US); Zhuo Li, Austin, TX (US); Derong Liu, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 73 days.

(21) Appl. No.: 16/416,008

(22) Filed: May 17, 2019

(51) Int. Cl.
*G06F 30/394* (2020.01)
*G06F 30/18* (2020.01)
*G06F 30/327* (2020.01)

(52) U.S. Cl.
CPC ............ *G06F 30/394* (2020.01); *G06F 30/18* (2020.01); *G06F 30/327* (2020.01)

(58) Field of Classification Search
CPC .................................................... G06F 30/394
USPC ......................................................... 716/129
See application file for complete search history.

(56) References Cited

U.S. PATENT DOCUMENTS

| | | | |
|---|---|---|---|
| 8,386,970 B2 * | 2/2013 | Ueda ...................... | G06F 30/394 716/54 |
| 2013/0346937 A1 * | 12/2013 | Kennedy ............... | G06F 30/398 716/122 |

* cited by examiner

*Primary Examiner* — Eric D Lee
(74) *Attorney, Agent, or Firm* — Schwegman Lundberg & Woessner, P.A.

(57) ABSTRACT

Various embodiments provide for routing a network of a circuit design based on at least one of a placement blockage or a layer-assigned network of a circuit design. For instance, some embodiments route a network of a circuit design (e.g., clock net, date net) by generating a congestion map based on modeling layer-assigned networks, considering (e.g., accounting for) routing congestion based on a placement blockage of the circuit design, or some combination of both.

11 Claims, 12 Drawing Sheets

ROUTING CONGESTION BASED ON LAYER-ASSIGNED NET AND PLACEMENT BLOCKAGE

TECHNICAL FIELD

Embodiments described herein relate to circuit design and, more particularly, to systems, methods, devices, and instructions for routing a net of a circuit design based on at least one of a layer-assigned circuit design network or a placement blockage, which may be part of electronic design automation (EDA).

BACKGROUND

Electronic design automation (EDA) software systems commonly perform routing of networks of circuit designs, such as clock networks (hereafter, clock nets). Usually, a network of a circuit design comprises a set of pins, and a routing process can route a path to connect the network. Net routing can be performed in two phases, where the first phase involves routing guides (e.g., global routing paths) that attempt to generate timing-aware/timing-based global routing of nets, and the second phase involves detailed routing of nets with specific wires (e.g., metal traces) based on the routing guides, while attempting to resolve/avoid one or more design rule violations.

Global routing can comprise two-dimensional (2D) net routing, layer assignment of wires of nets, or track assignment of wires of nets. Resolving congestion and major design rule constraints (DRCs) during global routing can facilitate detailed routing of nets. Conventional global routing can route nets of a circuit design by dividing the circuit design (e.g., each layer of the circuit design) into a grid of cells (also referred to as "global routing cells," "grid cell," or "g-cells"), where each grid cell comprises a set number of resources (e.g., horizontal and vertical resources, such as tracks) for routing a net, referred to as capacity, and a number of resources that are currently being used or demanded by global routing to route a network, referred to as demand. A cell can be square or rectangular in shape. Overflow for a given grid cell is usually determined by subtracting the demand for the given grid from the capacity of the given grid, where an overflow comprising a negative number indicates more demand for routing resources than available capacity of resources. A grid cell can be considered congested if a number of resources of the grid cell is less than what is needed to route a network through the grid cell, which is indicated by a negative number for overflow.

Based on the grid of cells, global routing can route a net of the circuit design by assigning the net to a set of specific grid cells and a set of specific layers (metal layer) of the circuit design. Generally, using grid cells permits global routing to speed up the process of finding the net routing solutions by analyzing routing congestion based on grid cell congestion and by reducing the number of pathways to consider for net routing.

BRIEF DESCRIPTION OF THE DRAWINGS

Various ones of the appended drawings merely illustrate various embodiments of the present disclosure and should not be considered as limiting its scope.

DETAILED DESCRIPTION

Figure 1:
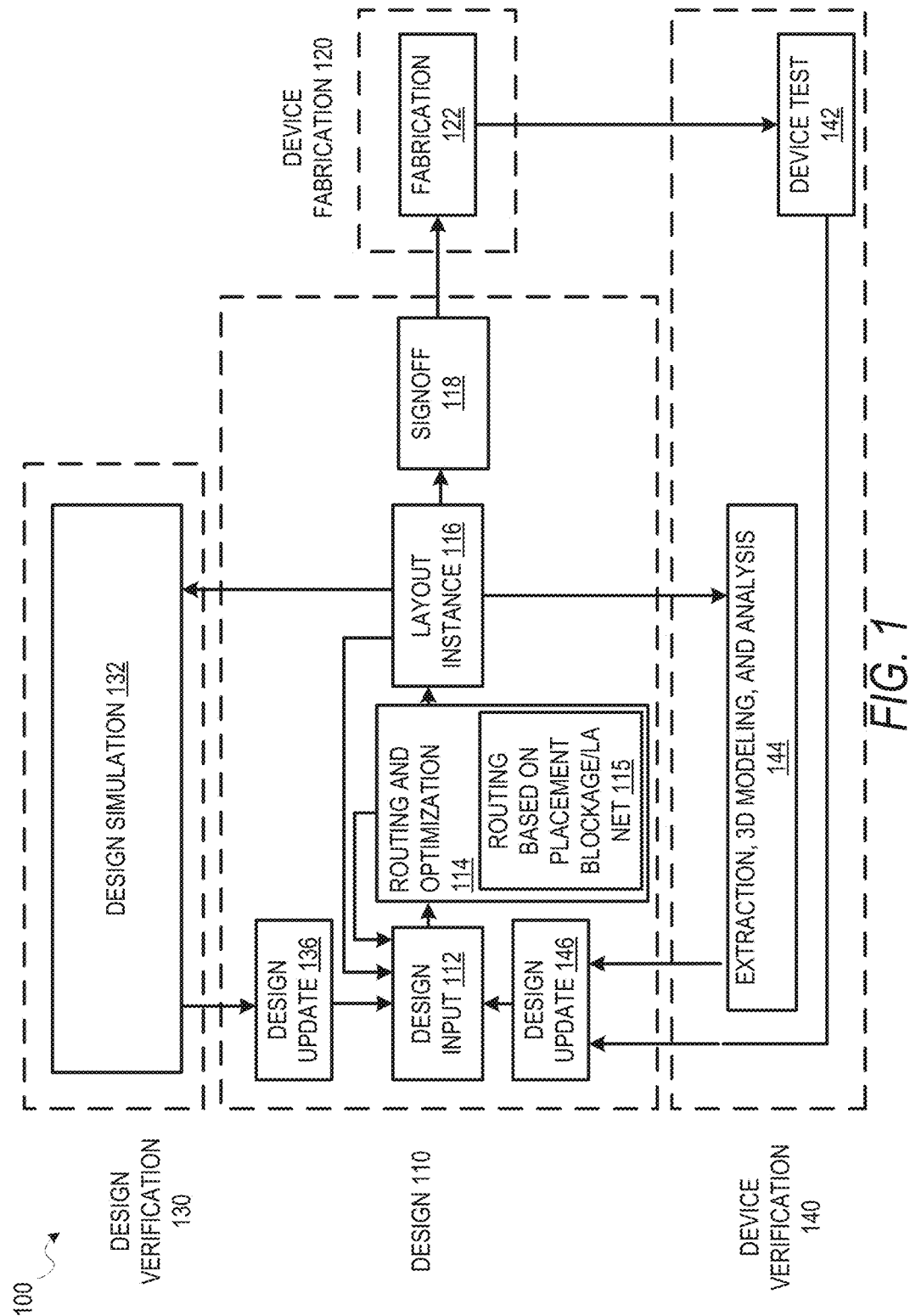
FIG. 1 is a diagram illustrating an example design process flow for routing a network of a circuit design based on at least one of a placement blockage or a layer-assigned network, according to some embodiments.

Various embodiments provide for routing a network (net) of a circuit design based on at least one of a placement blockage or a layer-assigned network (also referred to as a "layer-assigned network" or "LA network") of a circuit design. More particularly, some embodiments route a net of a circuit design (e.g., clock net, date net) by generating a congestion map based on modeling layer-assigned networks, considering (e.g., accounting for) routing congestion based on a placement blockage of the circuit design, or some combination of both.

For instance, some embodiments perform an initial routing process on a set of networks of a circuit design based on a set of placement blockages of the circuit design. In this way, the initial routing process can generate an initial routing topology for the set of networks of the circuit design, which can describe a set of grid cells for a set of layers of the circuit design (e.g., each layer of the circuit design). For some embodiments, the initial routing process comprises a global routing process. Some embodiments identify a first subset of grid cells (from the set of grid cells) that include (e.g., disposed over, overlap with, or contain) at least some portion of at least one placement blockage in the set of placement blockages. Additionally, some embodiments identify a second subset of grid cells (from the set of grid cells) that do not include any portion of any placement blockage in the set of placement blockages (e.g., different and mutually exclusive from the first subset of grid cells), but that are within a certain proximity to at least one placement blockage in the set of placement blockages. The first subset of grid cells can be considered those grid cells that overlap with the set of placement blockages, while the second subset of grid cells can be considered those grid cells that are close to or nearby the set of placement blockages. Accordingly, the first subset of grid cells and the second subset of grid cells are mutually exclusive. Depending on the embodiment, the first subset of grid cells can be assigned (e.g., configured to apply) a first routing penalty cost, and the second subset of grid cells can be assigned (e.g., configured to apply) a second routing penalty cost, where the first routing penalty cost is higher (e.g., slightly higher) than the second routing penalty cost. Through this assignment, a first routing penalty cost can be applied to each wire segment passing through a grid cell of the first subset of the grid cells (e.g., flag these wire segments with the first routing penalty cost), and a second routing penalty cost can be applied to each wire segment passing through a grid cell of the second subset of the grid cells (e.g., flag these wire segments with the second routing penalty cost). By applying routing penalty costs to wire segments (e.g., to their existing routing costs) in this way, various embodiments can generate adjusted routing costs for one or more wire segments passing through the first and second subsets of grid cells, which eventually can cause congestion to be spread away from the set of placement blockages during a subsequent routing process. Accordingly, some embodiments identify a set of wire segments, of a particular network of the circuit design, passing through any grid cell of the first subset of grid cells or the second subset of grid cells. This identified set of wire segments can represent wire segments that are causing congestion over the set of placement blockages.

Eventually, some embodiments re-route each wire segment, in the identified set of wire segments, based on adjusted routing costs assigned to any wire segment passing through a grid cell of the first subset of grid cells or a grid cell of the second subset of grid cells. For some embodiments, the re-routing process comprises a global routing process (e.g., similar global routing process to the one performed during the initial routing process) using the first subset of grid cells with the assigned first routing penalty cost and the second subset of grid cells with the assigned second routing penalty cost. By re-routing the identified set of wire segments, the wire segments can avoid the regions congested by the set of placement blockages.

According to some embodiments, re-routing a wire segment comprises defining (e.g., calculating) a bounding box for the wire segment, which can limit at least one of a wire length of the wire segment and runtime searching path for the re-routing process. At the beginning of the re-routing process, the set of wire segments can be sorted based on their length, overflow values, or some combination of both. For some embodiments, the re-routing process can comprise a two-level re-routing process, where the first level (e.g., top level) comprises applying a set of coarser (e.g., big) grid cells to deal with long wire segments, and the second level (e.g., bottom level) comprises applying a set of finer grid cells for routing short wire segments. The use of the two-level re-routing process can save runtime for re-routing the identified set of wire segments (e.g., by using bigger grid cells and having a good sorting on wire segments that need to be re-routed).

Unlike conventional techniques for circuit design routing (e.g., conventional global routing), various embodiments described herein can account for congestion hotspots over placement blockages of a circuit design, provide more accurate congestion estimation for a circuit design, or lessen design rule violations that show up during detailed routing of a circuit design. Various embodiments described herein enable a computer system to spread congestion away from a set of placement blockages in a circuit design (e.g., spread congestion to grid cells around the placement blockage) and, in doing so, create a smoother congestion map for the circuit design. In this way, various embodiments can enable a placement engine to better handle congestion in the circuit design and to generate a routable circuit design (e.g., a circuit design that is easier to route by a detailed routing process). Additionally, various embodiments can generate routing that is more accurate than conventional techniques and routing that is closer to the routing eventually generated by detailed routing.

For instance, some embodiments described herein can model congestion with respect to one or more grid cells of one or more layers of a circuit design. In particular, some embodiments emphasize congestion in a grid cell comprising a layer-assigned network, such as a timing-critical network. Generally, a timing-critical network has layer assignment constraints that cause it to be better suited for routing on higher layers of a circuit design. Accordingly, some embodiments can cause extra routing cost (e.g., demand) to be applied to grid cells that have one or more vias associated with a layer-assigned network. Specifically, when counting vias within a given grid cell to determine the overflow within the given grid cell, a via within the given grid that is associated with a layer-assigned network of a circuit design can be artificially counted as using more routing resources than a via within the given grid that is not associated with a layer-assigned network of the circuit design. As a result, a different routing cost (e.g., demand) can be attributed to vias associated with layer-assigned networks compared to vias not associated with layer-assigned networks. By adding routing cost (e.g., demand) to grid cells in this manner, some embodiments can cause a placement process (of an EDA) to better detect congestion (overflow) within the grid cells containing vias associated with layer-assigned networks and to spread circuit elements for those grid cells to reduce congestion (overflow) in those areas.

By modeling congestion with respect to layer-assigned networks as described herein, various embodiments can cause higher congestion to show for regions containing more timing-critical nets, indicate that resources used by a timing-critical net will be needed for higher layers of a circuit design, and indirectly prioritize timing-critical nets for a circuit design routing process (e.g., global routing process). In the meantime, various embodiments can assist a timing-critical net from being detoured and being routed to a lower layer, which can increase its timing delay. Accordingly, some embodiments can result in timing-critical nets within a circuit design being routed straighter than non-timing critical nets within the circuit design, even when there are limited routing resources within the circuit design. Additionally, based on the congestion determined by some embodiments, a placement process (e.g., of an EDA) can focus on one or more congested areas of a circuit design that comprise one or more timing-critical nets. Some embodiments can improve the overall timing of a circuit design. Furthermore, some embodiments can enable a computer system to cover timing considerations in circuit design routing faster than conventional methods of circuit design routing. Various embodiments described herein represent an improvement over conventional circuit design routing (e.g., global routing) techniques, which typically do not consider timing in congestion modeling.

According to some embodiments, a count of vias associated with (e.g., that are from) a layer-assigned network is generated for each of one or more grid cells (e.g., all grid cells) on each of one or more layers (e.g., all layers) of a circuit design. In view of the counts of vias for the one or more grid cells, a resource penalty demand can be added to each of the one or more grid cells that has vias associated with a layer-assigned network. Subsequently, a congestion map for the circuit design can be generated based on resulting demands of the grid cells of the circuit design.

As used herein, global routing can comprise determining a routing plan (e.g., one or more routing guides) for routing a physical wire (e.g., interconnect line or wire) within a circuit design between two or more nodes of circuit design (e.g., two pins or a source and a pin). For instance, global routing can route a wire (of a net of the circuit design) within the circuit design by dividing the circuit design (e.g., dividing each of one or more layers of the circuit design) into a grid of cells (e.g., grid cells), where each cell comprises a set number of resources (e.g., horizontal and vertical resources, such as tracks) for routing the wire. For some embodiments, each layer of a circuit design comprises its own grid of cells (e.g., grid cells). Additionally, for some embodiments, a routing blockage of a circuit design (e.g., on a layer of the circuit design) is marked with respect to a cell (e.g., grid cell) in the grid. Global routing can consider/account for one or more routing blockages of the circuit design when determining a route plan for a wire within the circuit design.

Global routing can route a wire (of the net) by assigning the net to a set of specific cells and a set of specific layers (metal layers) of the circuit design. In doing so, global routing can generate a routing plan for the wire that describes a set of connected cells (e.g., grid cells), between two or more nodes of the circuit design, that does not include obstructed cells. The routing plan (e.g., global routing plan) can comprise one or more routing guides that serve as "loose" routing paths or routing areas within which detailing routing can route a physical wire between two or more nodes (e.g., pins) of a circuit design.

As used herein, a routing blockage (or routing obstacle) can comprise a defined area of a circuit design that serves as an obstruction with respect to routing (e.g., routing a wire associated with a network of the circuit design, such as a clock net) through the defined area. For example, a routing blockage can be caused by a macro block included by a circuit design, which may be associated with a circuit design intellectual property (IP) block. A given routing blockage can comprise an area covering one or more layers of a circuit design (e.g., layers M1, M2, and M3). For various embodiments, circuit design routing routes a wire around a routing blockage.

As used herein, detailed routing can comprise routing a physical wire (e.g., interconnect wire) within a circuit design, between two or more nodes of the circuit design, based on a routing plan determined by global routing for the circuit design. The routing plan can provide a detailed routing process with a topology for routing wires, which in turn can enable detailed routing to route wires without violating one or more DRCs associated with a circuit design. This can be referred to as detailed routing being performed with clean DRCs. Accordingly, for some embodiments, global routing is performed on a circuit design prior to detailed routing being performed on the circuit design. Generally, global routing can be performed on a circuit design faster than performing detailing routing on the same circuit design. The routed wires of a circuit design can form a network of the circuit design.

As used herein, a placement blockage can comprise a defined area of a circuit design that prevent a placement process (e.g., placement engine) from placing cells at a specific location within the defined area. A placement blockage can be generated during floor planning of a circuit design and can function as a guideline for placement of standard cells. Additionally, a placement blockage can define a macro area within a circuit design and can prevent congestion near macros.

As used herein, a congestion map can describe a measure (e.g., estimated measure) of routing congestion for a set of grid cells on layer(s) (e.g., metal layers) of a circuit design, where the layers serve as interconnect structures for the circuit design. A measure of routing congestion for a given grid cell can be represented by one or more congestion ratios, such as one ratio for a horizontal routing resource and another ratio for a vertical routing resource. For example, a congestion ratio for a horizontal routing resource of a given grid can comprise a total number of horizontal routing resources demanded from the given grid cell by circuit elements (e.g., logical devices of the circuit design) within the given grid cell, divided by a total number of horizontal routing resources available (supplied) by the given grid cell. A congestion map can be implemented as a data structure, such as a two-dimensional array, for storing measured interconnect congestion for individual cells of the set of grid cells.

As used herein, a capacity map can describe a measure of routing resource capacity of a set of grid cells for layer(s) of a circuit design, such as horizontal and vertical resources (e.g., tracks) for routing a wire through each grid cell. For some embodiments, a capacity map is used by global routing to generate a set of routing guides between at least two nodes of the circuit design (e.g., between two pins or between a source and a pin). A capacity map for a circuit design can be generated based on a congestion map. As used herein, via capacity for a given grid cell can describe a capacity available in the given grid cell for vias.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 for routing a network of a circuit design based on at least one of placement blockage or a layer-assigned network, according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, routing, timing analysis, and optimization are performed in a routing and optimization 114 operation, along with any other automated design processes. The routing and optimization 114 operation may also include other operations not shown, such as those relating to floorplanning, placement, post-placement optimization, and post-routing optimization. As shown, the routing and optimization 114 operation includes a circuit design routing based on placement blockage/layer-assigned network 115 operation (hereafter, the routing based on placement blockage/LA net 115 operation), which may be performed in accordance with various embodiments described herein. For some embodiments, placement blockage/LA net 115 operation can be performed prior to detailed routing of a circuit design and, more particularly, during (e.g., as part of) global routing of the circuit design.

While the design process flow 100 shows optimization occurring prior to a layout instance 116, timing analysis and optimization may be performed at any time to verify operation of a circuit design. For instance, in various embodiments, timing analysis in a circuit design may be performed prior to routing of connections in the circuit design; after routing, during register transfer level (RTL) operations; or as part of a signoff 118, as described below.

Design inputs are used in the design input 112 operation to generate an initial circuit layout. The design inputs may be further processed during the design input 112 operation via a process, such as logic-synthesis to generate a circuit netlist mapped to a target standard library manufacturable by the foundry in fabrication 122 operation. After design inputs are used in the design input 112 operation to generate an initial circuit layout, and any of the routing and optimization 114 operations are performed, a resulting layout is generated as the layout instance 116. The netlist as placed by the layout instance 116 describes the physical layout dimensions of the device that match the design inputs. Prior to this layout being provided to a fabrication 122 operation, the signoff 118 is performed on the circuit design defined by the layout.

After signoff verification by the signoff 118, a verified version of the layout is used in the fabrication 122 operation to generate a device, or additional testing and design updates may be performed using designer inputs or automated updates based on design simulation 132 operations or extraction, 3D modeling, and analysis 144 operations. Once the device is generated, the device can be tested as part of device test 142 operations and layout modifications generated based on actual device performance.

As described in more detail below, a design update 136 from the design simulation 132 operations; a design update 146 from the device test 142 operations or the extraction, 3D modeling, and analysis 144 operations; or the design input 112 operation may occur after the initial layout instance 116 is generated. In various embodiments, whenever design inputs are used to update or change an aspect of a circuit design, a timing analysis and the routing and optimization 114 operation may be performed.

FIGS. 2 through 5 are flowcharts illustrating example methods for routing a network of a circuit design based on a placement blockage, according to some embodiments. It will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. For instance, the operations of a method 200 of FIG. 2 may be represented by executable instructions that, when executed by a processor of a computing device, cause the computing device to perform the method 200. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel.

Figure 2:
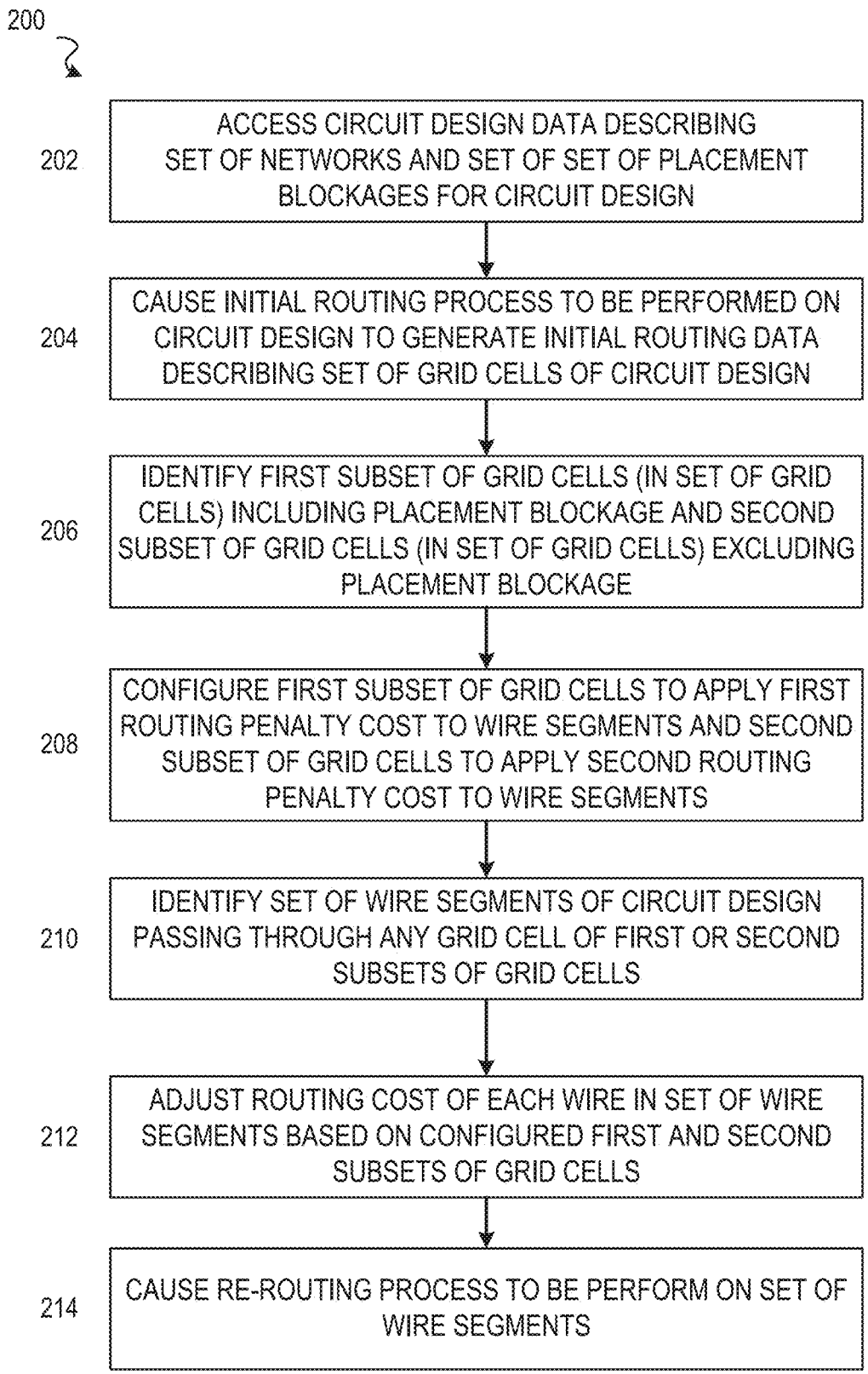
FIGS. 2 through 5 are flowcharts illustrating example methods for routing a network of a circuit design based on a placement blockage, according to some embodiments.

Referring now to FIG. 2, the flowchart illustrates the example method 200 for routing a network of a circuit design based on a placement blockage, according to some embodiments. For some embodiments, the method 200 is performed as part of a global routing process with respect to a circuit design (e.g., by an EDA software system). An operation of the method 200 (or another method described herein) may be performed by a hardware processor (e.g., central processing unit or graphics processing unit) of a computing device (e.g., desktop, server, etc.).

The method 200 as illustrated begins with operation 202 accessing circuit design data describing a set of networks of a circuit design and a set of placement blockages of the circuit design. The method 200 then continues with operation 204 causing an initial routing process to be performed on the circuit design to generate initial routing data describing a set of grid cells of the circuit design. The set of grid cells can be disposed on one or more layers (e.g., all layers) of the circuit design. For some embodiments, the initial routing process comprises a global routing process.

The method 200 continues with operation 206 identifying, in the set of grid cells, a first subset of grid cells and a second subset of grid cells. For some embodiments, operation 206 is performed such that each grid cell in the first subset of grid cells includes at least a portion of at least one placement blockage in the set of placement blockages, and such that each grid cell in the second subset of grid cells is within a certain proximity to at least one placement blockage in the set of placement blockages but does not include any portion of any placement blockage in the set of placement blockages.

The method 200 continues with operation 208 configuring (e.g., assigning or flagging) the first subset of grid cells to apply a first routing penalty cost to each wire segment (of a network) of the circuit design that passes through a grid cell of the first subset of grid cells, and the second subset of grid cells to apply a second routing penalty cost to each wire segment of the circuit design passing through a grid cell of the second subset of grid cells. For some embodiments, the first routing penalty cost is higher than the second routing penalty cost. By operations 206 and 208, various embodiments can mark a grid cell of the circuit design that overlaps with a placement blockage of the circuit design and mark a grid cell of the circuit design that is nearby (but does not necessarily overlap with) a placement blockage of the circuit design. In doing so, various embodiments described herein can apply two different routing penalty costs with respect to placement blockages, which in turn can assist in wire segments avoiding congestion.

The method 200 continues with operation 210 identifying a set of wire segments of the circuit design that pass through any grid cell of at least one of the first subset of grid cells or the second subset of grid cells. The method 200 then continues with operation 212 adjusting a routing cost of each wire segment in the set of wire segments (identified by operation 210) based on at least one of the configured first subset of grid cells or the configured second subset of grid cells (as configured by operation 208). In particular, some embodiments adjust the routing cost of a given wire segment passing through a grid cell of the first subset of grid cells based on the configured first subset of grid cells by applying the first routing penalty cost to the given wire segment's existing routing cost. Similarly, some embodiments adjust the routing cost of a given wire segment passing through a grid cell of the second subset of grid cells based on the configured second subset of grid cells by applying the second routing penalty cost to the given wire segment's existing routing cost. Application of the first routing penalty cost or the second routing penalty to a given wire segment can comprise flagging the given wire segment with the appropriate routing penalty cost.

The method 200 continues with operation 214 causing a re-routing process to be performed on at least the set of wire segments identified by operation 210. By operation 214, an embodiment described herein can re-route one or more of the wire segments (of a network of the circuit design) that could be causing congestion over one or more placement blockages of the circuit design. As a result, various embodiments generate a circuit design based on congestion estimation in view of placement blockages of the circuit design, where the congestion estimation is more accurate than what is produced by traditional metrologies.

For some embodiments, causing the re-routing process at operation 214 comprises sorting the set of wire segments to generate a sort order for the set of wire segments and causing the re-routing process to be performed on the set of wire segments according to the sort order. Depending on the embodiment, the set of wire segments is sorted based on at least one of wire-length or overflow value of the wire segments.

For some embodiments, causing the re-routing process at operation 214 comprises defining (e.g., calculating) a bounding box for a given wire segment in the set of wire segments. Subsequently, some embodiments cause the re-routing process to be performed on the given wire segment based on the bounding box. According to some embodiments, using the bounding box in this way can limit wire length of the wire segment, limit the runtime searching path for the re-routing process, or a combination of both. For some embodiments, some or all of these steps of operation 214 are performed similar to method 300 of FIG. 3 as described herein.

For some embodiments, causing the re-routing process at operation 214 comprises dividing, based on a wire-length threshold, the set of wire segments into a first subset of wire segments and a second subset of wire segments such that each wire segment in the first subset of wire segments has a wire-length above the wire-length threshold. As a result, the second subset of wire segments comprises those wire segments (of the set of wire segments) that are not included by the first subset of wire segments. With respect to the first subset of wire segments, some embodiments cause a first re-routing process to be performed on the first subset of wire segments, where the first routing process uses a first plurality of grid cells to re-route the first subset of wire segments and uses a second plurality of grid cells to re-route any wire segment in the first subset of wire segments not re-routed by the first plurality of grid cells, where the second plurality of grid cells are smaller than any grid cell of the first plurality of grid cells. In this way, the first re-routing process can implement a two-level re-routing process, where the two-level re-routing process uses coarse grid cells to re-route the first subset of wire segments and uses fine grid cells (finer than the coarse grid cells) to re-route the second subset of wire segments. The second subset of wire segments represent those not routed by the coarse grid cells. Subsequently, the topologies of the re-routed first subset of wire segments can be refined based on the routing solution generated by the coarse grid cells. For some embodiments, some or all of these steps of operation 214 are performed similar to the method 400 of FIG. 4 and the method 500 of FIG. 5 as described herein.

With respect to the second subset of wire segments, some embodiments cause a second re-routing process to be performed on the second subset of wire segments, where the second routing process is different from the first re-routing process. In particular, for some embodiments, the second re-routing process comprises defining (e.g., calculating) a bounding box for a given wire segment in the second subset of wire segments, and causing the re-routing process to be performed on the given wire segment based on the bounding box. As noted herein, for some embodiments, some or all of these steps of operation 214 are performed similar to method 300 of FIG. 3 as described herein.

Figure 3:
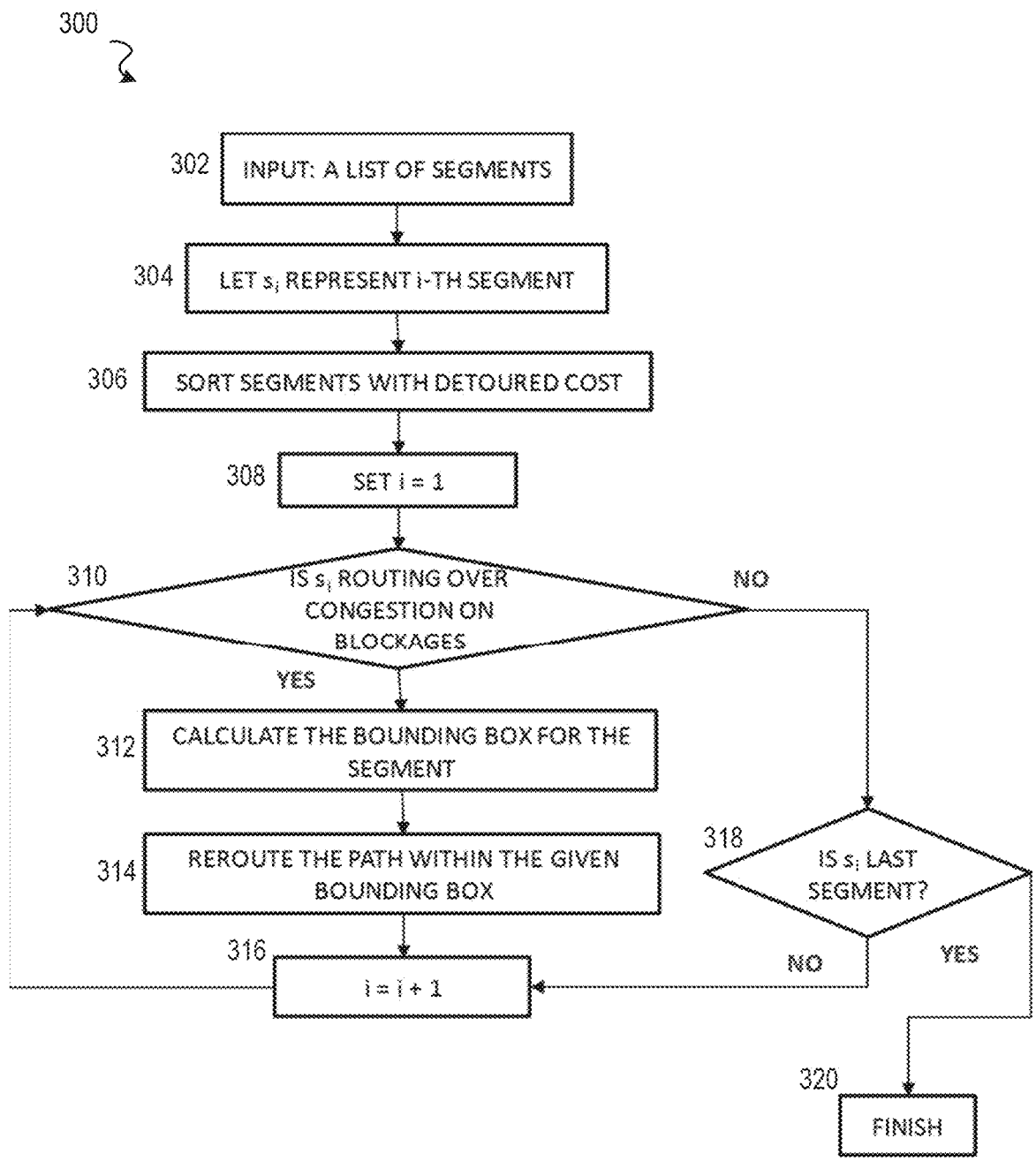

Referring now to FIG. 3, the flowchart illustrates the example method 300 for using a bounding box to re-route a wire segment, according to some embodiments. For some embodiments, the method 300 is performed once for each different layer of the circuit design. Like the method 200 of FIG. 2, the method 300 can be performed as part of as part of a global routing process with respect to a circuit design (e.g., by an EDA software system). An operation of the method 300 may be performed by a hardware processor.

The method 300 as illustrated begins with operation 302 accessing a list of wire segments as input and, at operation 304, letting variable $s_i$ represent the $i^{th}$ wire segment in the list of wire segments. The method 300 continues with operation 306 sorting the list of wire segments with detoured routing cost (e.g., resulting from operation 212 of the method 200 described above with respect to FIG. 2). The method 300 continues with operation 308 initially setting variable i to a value of 1. The method 300 continues with operation 310 determining whether the wire segment represented by $s_i$ passes over congestion on a placement blockage. For some embodiments, operation 310 can further use a congestion threshold (e.g., defined by a user) to determine whether the wire segment is to be re-routed. If yes, the method 300 continues to operation 312; otherwise the method 300 continues to operation 318. Operation 318 determines whether the wire segment represented by $s_i$ is the last in the list of wires accessed at operation 302. If yes, the method 300 finishes at operation 320; otherwise the method 300 continues to operation 316, where variable i is incremented by a value of 1 and the method 300 then returns to operation 310.

If the method 300 continues to operation 312, operation 312 determines (e.g., calculates) the bounding box for the wire segment. The method 300 continues with operation 314 causing a re-routing process to re-route the path of the wire segment within the bound box determined at operation 312. The method 300 continues with operation 316, where variable i is incremented by a value of 1 and the method 300 then returns to operation 310.

Figure 4:
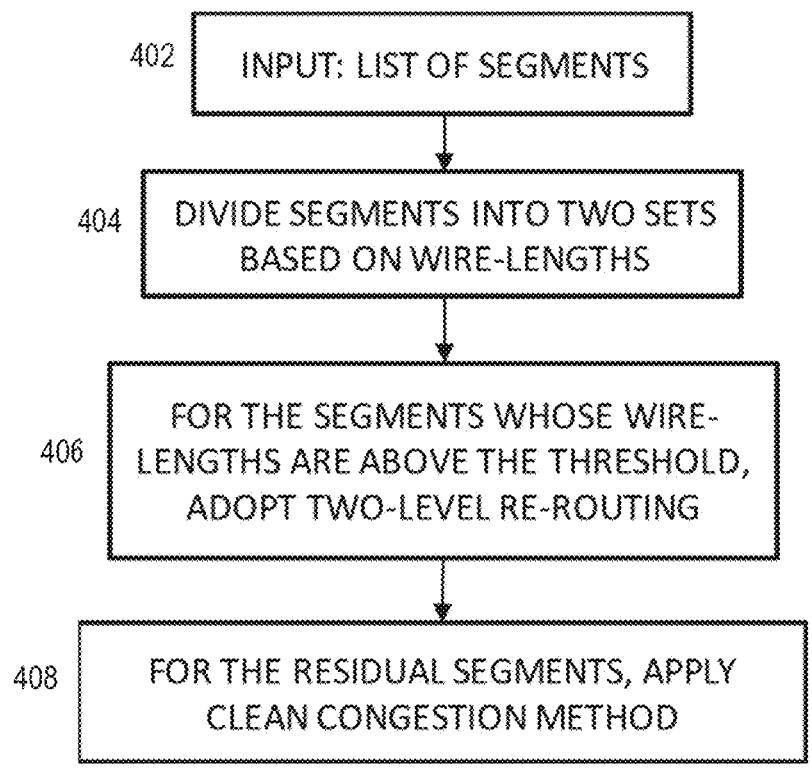

Referring now to FIG. 4, the flowchart illustrates the example method 400 for performing a two-level re-routing process on a set of wire segments of a circuit design, according to some embodiments. For some embodiments, the method 400 is performed once for each layer of the circuit design. Like the method 200 of FIG. 2, the method 400 can be performed as part of as part of a global routing process with respect to a circuit design (e.g., by an EDA software system). An operation of the method 400 may be performed by a hardware processor.

The method 400 as illustrated starts at operation 402 accessing a list of wire segments as input. For some embodiments, the list of wire segments are those identified (e.g., by operation 210 of the method 200 described above with respect to FIG. 2) as passing through a first subset of grid cells that cover a set of placement blockages of the circuit design of the circuit design or passing through a second subset of grid cells in proximity to a set of placement blockages of the circuit design.

The method 400 continues with operation 404 dividing, based on a wire-length threshold, the set of wire segments into a first subset of wire segments and a second subset of wire segments such that each wire segment in the first subset of wire segments has a wire-length above the wire-length threshold. The method 400 continues with operation 406 causing a two-level re-routing to be performed on those wire segments whose wire-lengths that are above the wire-length threshold. As described herein, for some embodiments, the two-level re-routing process uses coarse grid cells to re-route the first subset of wire segments and uses fine grid cells (finer than the coarse grid cells) to re-route the second subset of wire segments.

The method 400 continues with operation 408 applying a clean congestion method, represented by the method 300 of FIG. 3, to residual wire segments not processed by operation 406.

Figure 5:
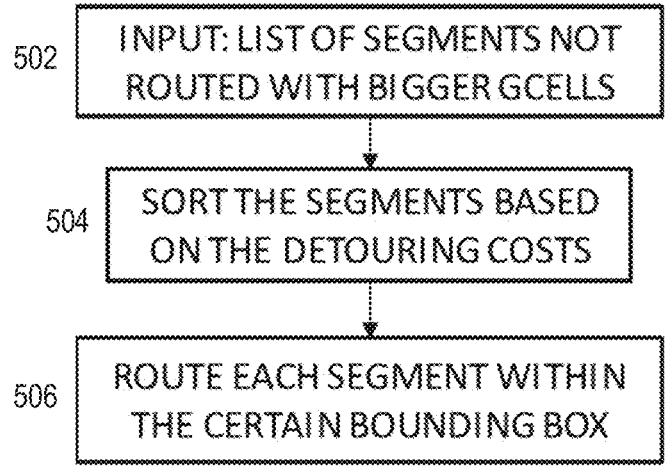

Referring now to FIG. 5, the flowchart illustrates the example method 500 for performing a re-routing process on a set of wire segments of a circuit design using a set of fine grid cells, according to some embodiments. For some embodiments, the method 500 is performed for those wire segments with overflows (e.g., those not processed by a set of coarse grid cells by operation 406 of the method 400 described above with respect to FIG. 4). Like the method 200 of FIG. 2, the method 500 can be performed as part of a global routing process with respect to a circuit design (e.g., by an EDA software system). An operation of the method 400 may be performed by a hardware processor.

The method 500 as illustrated starts at operation 502 accessing as input a list of wire segments not processed by a set of coarse grid cells as described herein. The method 500 continues with operation 504 sorting the list of wire segments based on the detouring cost (e.g., resulting from operation 212 of the method 200 described above with respect to FIG. 2). The method 500 continues with operation 506 re-routing each wire segment in the list of wire segments within a certain bounding box.

Figure 6:
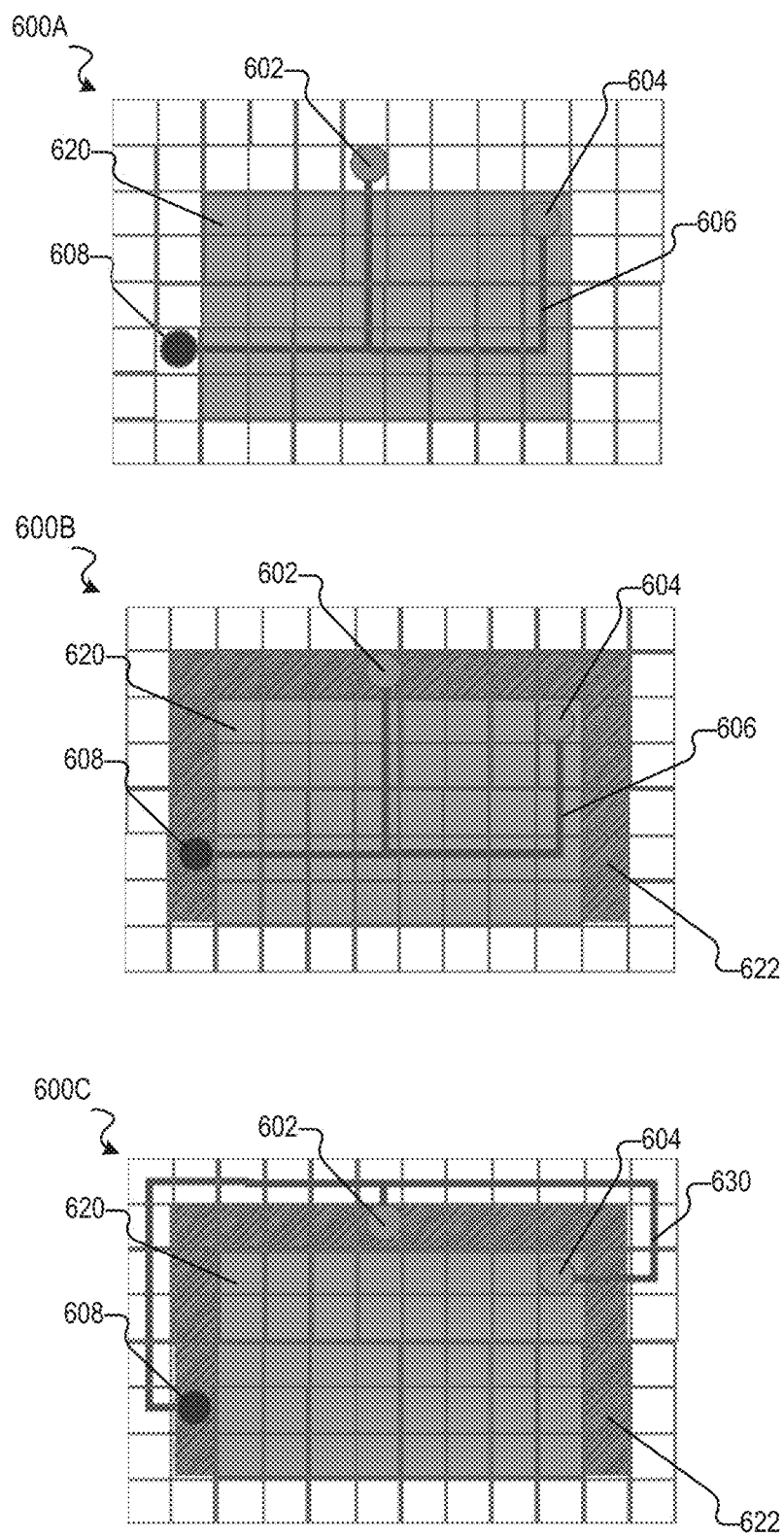
FIG. 6 is a diagram illustrating re-routing of an example multi-pin network of a circuit design, according to some embodiments.

FIG. 6 is a diagram illustrating re-routing of an example multi-pin network 600 of a circuit design, according to some embodiments. In particular, the diagram illustrates an example of performing re-routing based on a placement blockage using one or more of methods 300, 400, 500 described above with respect to FIGS. 3 through 5. The multi-pin network 600 comprises a source pin 608 and two receiving pins 602 and 604. The multi-pin network 600A represents a routed network generated by an initial routing process (e.g., comprising a global routing process) of some embodiments described herein, which results in a route 606 being generated from the source pin 608 to the receiving pins 602, 604 while passing over a placement blockage 620 of the circuit design. With respect to the multi-pin network 600B, FIG. 6 illustrates a set of grid cells 622 (e.g., second subset of grid cells identified by operation 206 of the method 200 described with respect to FIG. 2). The multi-pin network 600C represents the multi-pin network 600A after re-routing based on a set of grid cells over the placement blockage 620 (e.g., first subset of grid cells identified by operation 206 of the method 200 described with respect to FIG. 2) and the set of grid cells 622, in accordance with some embodiments. As shown, the multi-pin network 600C comprises a new route 630 from the source pin 608 to the receiving pins 602, 604.

Figure 7:
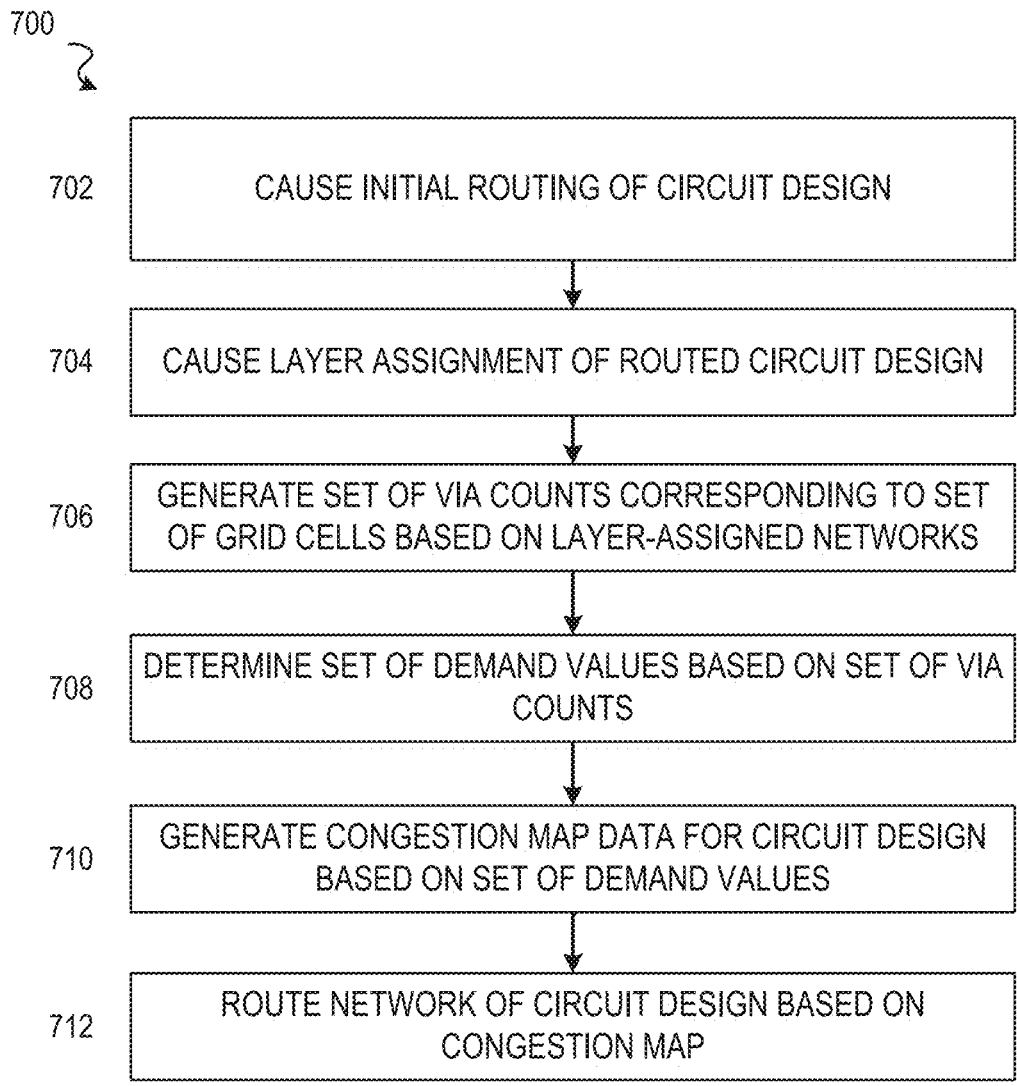
FIGS. 7 through 9 are flowcharts illustrating example methods for routing a network of a circuit design based on a layer-assigned network, according to some embodiments.
Figure 8:
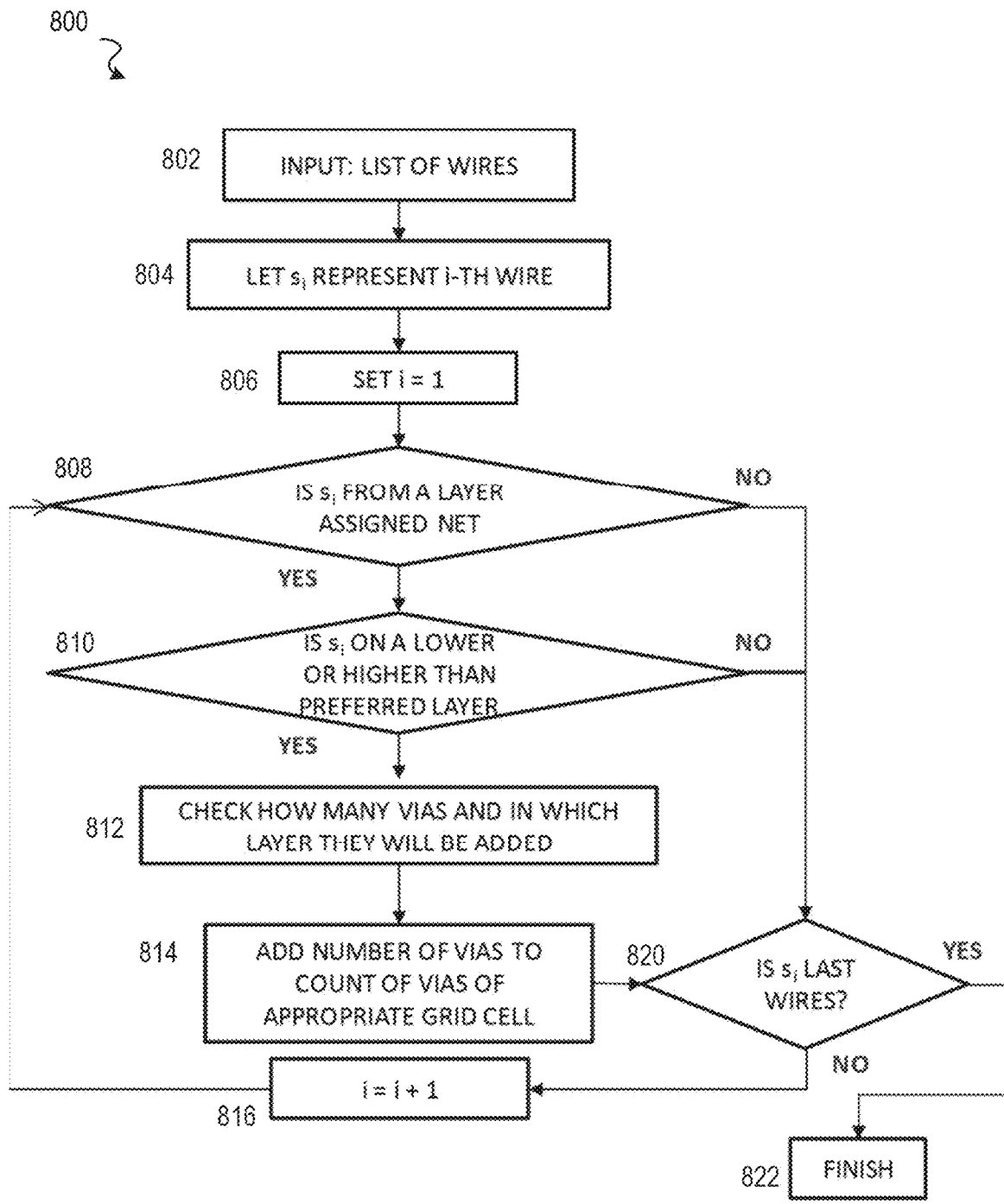
Figure 9:
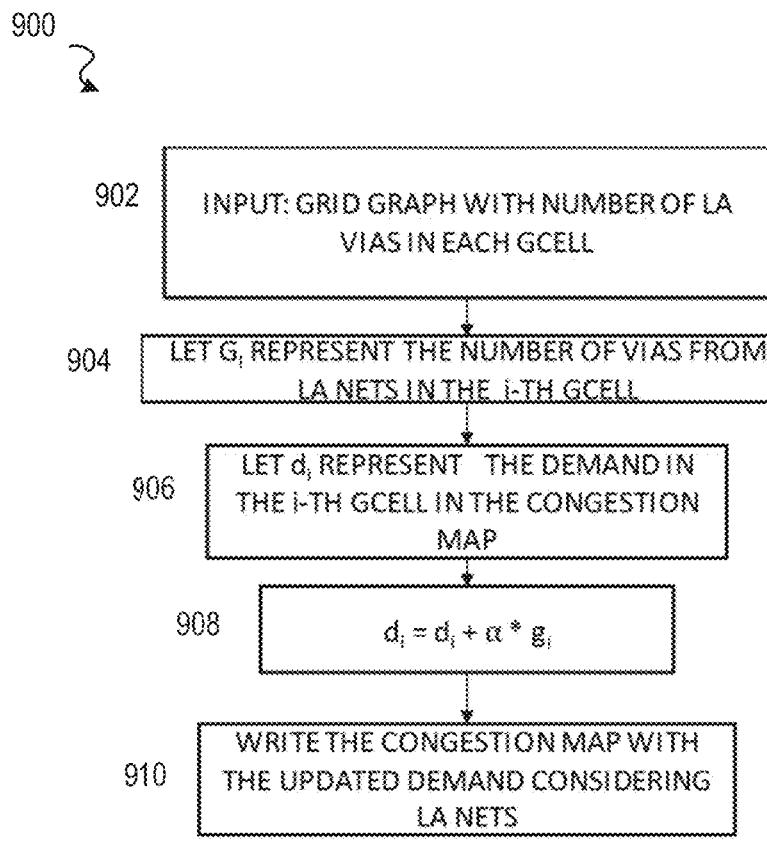

FIGS. 7 through 9 are flowcharts illustrating example methods for routing a network of a circuit design based on a layer-assigned network, according to some embodiments. It will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. For instance, the operations of a method 700 of FIG. 7 may be represented by executable instructions that, when executed by a processor of a computing device, cause the computing device to perform the method 700. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel.

Referring now to FIG. 7, the flowchart illustrates the example method 700 for routing a network of a circuit design based on a layer-assigned network, according to some embodiments. For some embodiments, the method 700 is performed as part of a global routing process with respect to a circuit design (e.g., by an EDA software system). An operation of the method 700 (or another method described herein) may be performed by a hardware processor (e.g., central processing unit or graphics processing unit) of a computing device (e.g., desktop, server, etc.).

The method 700 as illustrated begins with operation 702 causing an initial routing process to be performed on a circuit design to generate a routed circuit design. For some embodiments, the initial routing process comprises a global routing process. The method 700 continues with operation 704 causing layer assignment to be performed on a set of routed networks of the routed circuit design (generated by operation 702) to generate a set of layer-assigned networks. The set of layer-assigned networks may be described by wiring data that results from operation 704. The wiring data may describe, for instance, one or more of grid cell location and layer location of a via. Additionally, the wiring data can describe (or at least indicate the locations) of a set of vias for a set of wires.

The method 700 continues with operation 706 generating a set of via counts that corresponds to a set of grid cells for the circuit design by determining a count of vias in each grid cell of the set of grid cells that are associated with a layer-assigned network in the set of layer-assigned networks. The set of grid cells can be disposed on one or more layers (e.g., all layers) of the circuit design. For some embodiments, the set of grid cells is generated as part of performing the initial routing process at operation 702. For some embodiments, some or all of operation 706 is performed similar to method 800 of FIG. 8 as described herein.

The method 700 continues with operation 708 determining a set of demand values that corresponds to the set of grid cells based on the set of via counts (generated at operation 706). According to various embodiments, a given demand value, in the set of demand values, corresponds to a given grid cell in the set of grid cells, and the given demand value represents an additional resource demand value caused by one or more vias associated with a layer-assigned network in the given grid cell. For some embodiments, the set of via counts associated with a layer-assigned network facilitates modeling layer-assigned networks for individual grid cells. The set of demand values can represent additional resource demands that result from (e.g., demand penalties generated by) modeling the layer-assigned networks for the individual grid cells and that can be applied to corresponding grid cells as described herein.

The method 700 continues with operation 710 generating congestion map data for the circuit design based on the set of demand values (determined at operation 708), where the congestion map data can describe routing congestion for the set of grid cells. For some embodiments, generating the congestion map data based on the set of demand values comprises accessing prior congestion map data for the set of grid cells (e.g., congestion map data generated using conventional techniques), and generating the congestion map by updating the prior congestion map data based on the set of demand values. Updating the prior congestion map data based on the set of demand values can comprise adjusting existing demand values described in the prior congestion map data by a corresponding demand value from the set of demand values. In doing so, a demand penalty represented by the corresponding demand value can be applied to the existing demand value. For some embodiments, the prior congestion map data comprises data describing a set of existing (routing) demand values previously determined for the set of grid cells. In such embodiments, updating the prior congestion map data based on the set of demand values can comprise adding a value, based on a given demand value (in the set of demand values) for a given grid cell, to a given existing demand value (in the set of existing demand values) for the given grid cell to generate an updated demand value for the given grid cell.

For some embodiments, some or all of operations 708 and 710 are performed similar to method 900 of FIG. 9 as described herein.

The method 700 continues with operation 712 routing a network of the circuit design based on the congestion map data generated by operation 710. For some embodiments, routing the network of the circuit design based on the congestion map data comprises performing detailed routing on the circuit design based on the congestion map data.

Referring now to FIG. 8, the flowchart illustrates the example method 800 for generating a set of via counts that corresponds to a set of grid cells for a circuit design, according to some embodiments. In particular, the method 800 can count a number of vias associated with a layer-assigned network in each grid cell on a particular layer of the circuit design. For some embodiments, the method 800 is performed once for each different layer of the circuit design to count a number of vias (associated with a layer-assigned network) on those different layers of the circuit design. Like the method 700 of FIG. 7, the method 800 can be performed as part of as part of a global routing process with respect to a circuit design (e.g., by an EDA software system). An operation of the method 800 may be performed by a hardware processor.

The method 800 as illustrated begins with operation 802 accessing a list of wire segments as input and, at operation 804, letting variable $s_i$ represent the $i^{th}$ wire segment in the list of wire segments. The method 800 continues with operation 806 initially setting variable i to a value of 1. The method 800 continues with operation 808 determining whether the wire segment represented by st is from a layer assigned network. If yes, the method 800 continues to operation 810; otherwise the method 800 continues to operation 820. Operation 820 determines whether the wire segment represented by $s_i$ is the last in the list of wire segments accessed at operation 802. If yes, the method 800 finishes at operation 822; otherwise the method 800 continues to operation 816, where variable i incremented by a value of 1 and the method 800 then returns to operation 808.

If the method 800 continues to operation 810, operation 810 determines whether the wire segment represented by $s_i$ is on a lower or higher than preferred layer of the circuit design. If yes, the method 800 continues to operation 812, otherwise the method 800 continues to operation 820.

If the method 800 continues to operation 812, operation 812 checks how many vias are associated with the wire segment represented by $s_i$ and in which layer they will be added. The method 800 continues with operation 814 adding (e.g., updating) the number of vias determined by operation 812 to the count of vias of the appropriate grid cell on the appropriate layer. The method 800 continues to operation 820.

Referring now to FIG. 9, the flowchart illustrates the example method 900 for determining a set of demand values (that corresponds to the set of grid cells) based on a set of via counts (for vias associated with a layer-assigned network) and for generating congestion map data for the circuit design based on the set of demand values, according to some embodiments. In particular, the method 900 can determine a given demand value (in the set of demand values) for the $i^{th}$ grid cell and can update an existing demand value for (from an existing congestion map) for the $i^{th}$ grid cell based on the given demand value to write a congestion map with an updated demand. For some embodiments, the method 900 is performed once for each via count in the set of via counts for a given layer z of the circuit design. Additionally, the method 900 can further be repeated for other layers of the circuit design. Like the method 700 of FIG. 7, the method 900 can be performed as part of as part of a global routing process with respect to a circuit design (e.g., by an EDA software system). An operation of the method 900 may be performed by a hardware processor.

The method 900 as illustrated starts at operation 902 accessing a grid graph that lists number of LA vias (i.e., vias associated with a layer-assigned network) in each grid cell for one or more layers of a circuit design. The grid graph can represent the set of via counts described herein and, for some embodiments, can be generated by the method 800 described herein with respect to FIG. 8.

The method 900 continues with operation 904 letting variable $g_i$ represent the number of vias counted in the $i^{th}$ grid cell on layer z of the circuit design. The method 900 continues with operation 906 letting variable $d_i$ represent a demand (a prior or existing demand value) for the grid cell $g_i$ in an existing congestion map. The method 900 continues with operation 908 updating the demand $d_i$ by the following Equation 1, $$d_i = d_i + \alpha \times g_i,$$

where $\alpha$ represents a multiplier value that can be tuned by a user (e.g., EDA user). Eventually, the method 900 continues with operation 910 writing (e.g., generating) a congestion map with the demand updated at operation 908.

Figure 10:
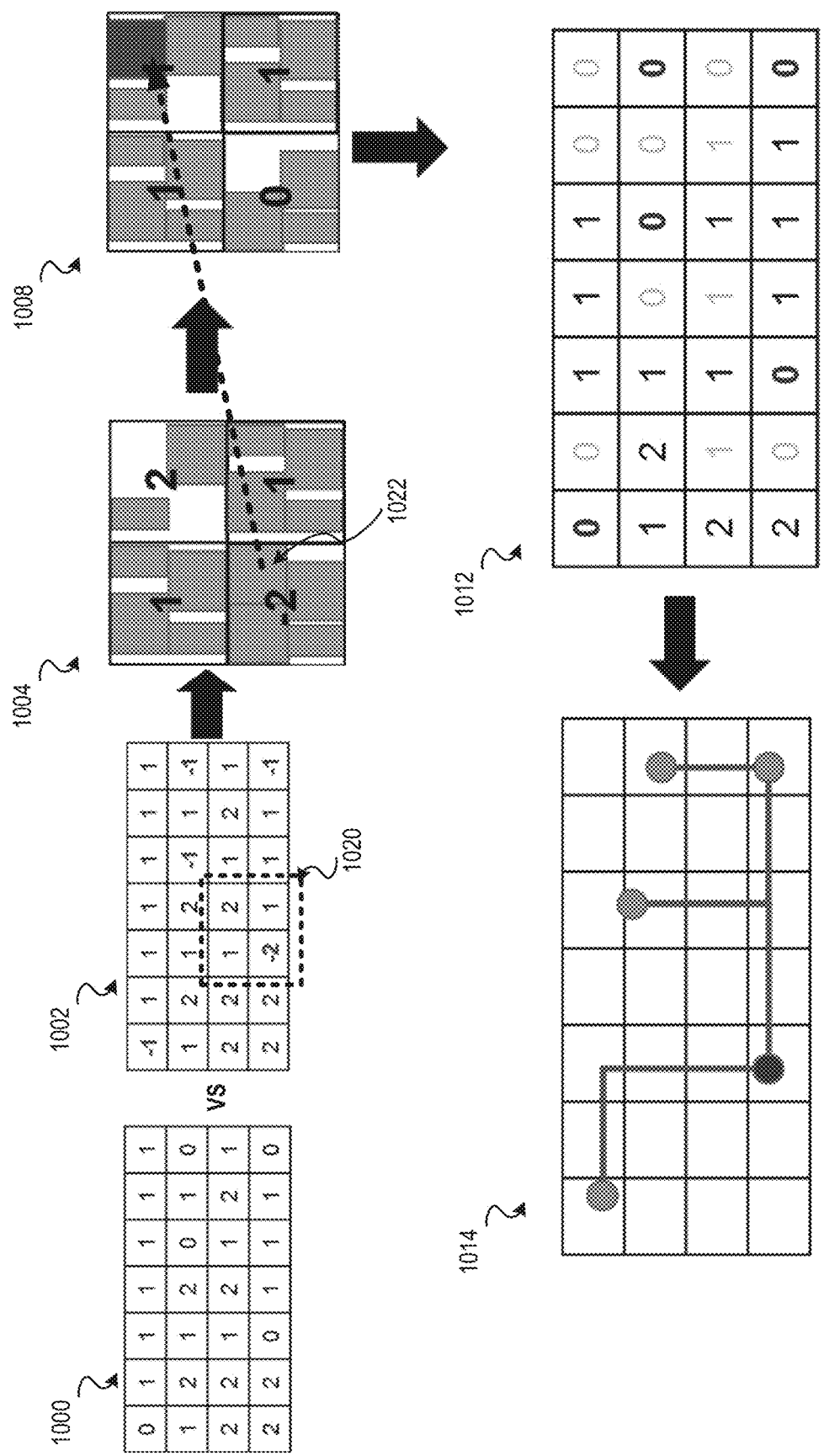
FIG. 10 is a diagram illustrating routing results produced by an example method for routing a network of a circuit design based on a layer-assigned network, according to some embodiments.

FIG. 10 is a diagram illustrating routing results produced by an example method for routing a network of a circuit design based on a layer-assigned network, according to some embodiments, which can cause a placement process to spread congestion amongst grid cells of a layer. FIG. 10 illustrates a plurality of grid cells 1000 (of a circuit design) overlain with demand values generated by traditional methodologies, and also illustrates a plurality of grid cells 1002 (of the same circuit design) overlain with demand values generated by traditional congestion estimation methodologies. A plurality of grid cells 1004 illustrates a portion 1020 of the grid cells 1002 with standard (circuit) cells within each grid cell. For grid cells 1004, the −2 demand value of the lower left grid cell represents congestion with respect to that grid cell and, based on observing this congestion, a placement process (of an EDA) can move standard cell 1022 from the lower left grid cell to the upper right grid cell, which causes the placement process to reduce the congestion of the lower left grid cell (from a demand value of −2 to a demand value of 0). This is illustrated in a plurality of grid cells 1008. Based on similar changes by a placement process, congestion can be spread amongst more grid cells. This is illustrated by a plurality of grid cells 1012, which can result with reduction and spreading of congestion values in comparison to plurality of grid cells 1002. Eventually, based on this spreading of congestion that results, a routing process (e.g., detailed routing process) can generate a routed circuit design network 1014 that has less congestion, while keeping layer assignment and topology the same in comparison to traditional methodologies.

Figure 11:
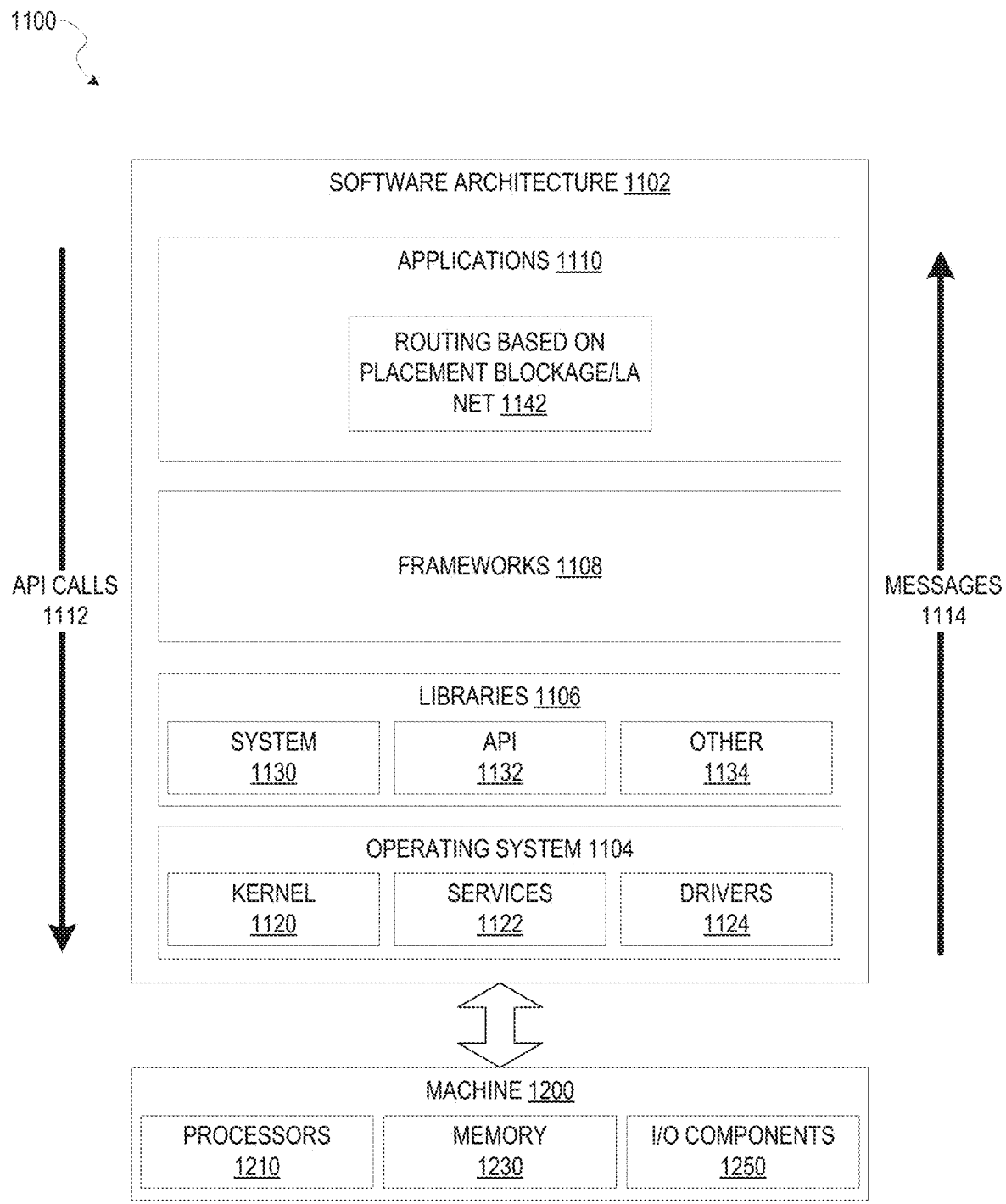
FIG. 11 is a block diagram illustrating an example of a software architecture that may be operating on an EDA computing device and may be used with methods for routing a network of a circuit design based on at least one of a placement blockage or a layer-assigned circuit design network, according to some embodiments.

FIG. 11 is a block diagram 1100 illustrating an example of a software architecture 1102 that may be operating on an EDA computer and may be used with methods for routing a network of a circuit design based on at least one of placement blockage or a layer-assigned network, according to some embodiments. The software architecture 1102 can be used as an EDA computing device to implement any of the methods described above. Aspects of the software architecture 1102 may, in various embodiments, be used to store circuit designs, and to facilitate generation of a circuit design in an EDA environment by routing a network of a circuit design based at least one of placement blockage or a layer-assigned network, from which physical devices may be generated.

FIG. 11 is merely a non-limiting example of a software architecture 1102, and it will be appreciated that many other architectures can be implemented to facilitate the functionality described herein. In various embodiments, the software architecture 1102 is implemented by hardware such as a machine 1200 of FIG. 12 that includes processors 1210, memory 1230, and input/output (I/O) components 1250. In this example, the software architecture 1102 can be conceptualized as a stack of layers where each layer may provide a particular functionality. For example, the software architecture 1102 includes layers such as an operating system 1104, libraries 1106, software frameworks 1108, and applications 1110. Operationally, the applications 1110 invoke application programming interface (API) calls 1112 through the software stack and receive messages 1114 in response to the API calls 1112, consistent with some embodiments. In various embodiments, any client device, any server computer of a server system, or any other device described herein may operate using elements of the software architecture 1102. An EDA computing device described herein may additionally be implemented using aspects of the software architecture 1102, with the software architecture 1102 adapted for operating to circuit design routing in any manner described herein.

In some embodiments, an EDA application of the applications 1110 performs circuit design routing according to embodiments described herein using various modules within the software architecture 1102. For example, in some embodiments, an EDA computing device similar to the machine 1200 includes the memory 1230 and the one or more processors 1210. The processors 1210 also implement a circuit design routing based on placement blockage/layer-assigned network module 1142 (hereafter, the routing based on placement blockage/LA net module 1142) for routing a network of a circuit design based on at least one of placement blockage or a layer-assigned network, in accordance with various embodiments described herein.

In various other embodiments, rather than being implemented as modules of the one or more applications 1110, the routing based on placement blockage/LA net module 1142 may be implemented using elements of the libraries 1106, the operating system 1104, or the software frameworks 1108.

In various implementations, the operating system 1104 manages hardware resources and provides common services. The operating system 1104 includes, for example, a kernel 1120, services 1122, and drivers 1124. The kernel 1120 acts as an abstraction layer between the hardware and the other software layers, consistent with some embodiments. For example, the kernel 1120 provides memory management, processor management (e.g., scheduling), component management, networking, and security settings, among other functionality. The services 1122 can provide other common services for the other software layers. The drivers 1124 are responsible for controlling or interfacing with the underlying hardware, according to some embodiments. For instance, the drivers 1124 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 1106 provide a low-level common infrastructure utilized by the applications 1110. The libraries 1106 can include system libraries 1130 such as libraries of blocks for use in an EDA environment or other libraries that can provide functions such as memory allocation functions, string manipulation functions, mathematic functions, and the like. In addition, the libraries 1106 can include API libraries 1132 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in 2D and 3D in a graphic context on a display), database libraries (e.g., SQLite to provide various relational database functions), web libraries (e.g., WebKit to provide web browsing functionality), and the like. The libraries 1106 may also include other libraries 1134.

The software frameworks 1108 provide a high-level common infrastructure that can be utilized by the applications 1110, according to some embodiments. For example, the software frameworks 1108 provide various graphic user interface (GUI) functions, high-level resource management, high-level location services, and so forth. The software frameworks 1108 can provide a broad spectrum of other APIs that can be utilized by the applications 1110, some of which may be specific to a particular operating system 1104 or platform. In various embodiments, the systems, methods, devices, and instructions described herein may use various files, macros, libraries, and other elements of an EDA design environment to implement routing a network of a circuit design based on at least one of placement blockage or a layer-assigned network as described herein. This includes analysis of input design files for an integrated circuit design, along with any element of hierarchical analysis that may be used as part of or along with the embodiments described herein. While netlist files, library files, SDC files, and view definition files are examples that may operate within the software architecture 1102, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines 1200 including processors 1210), with these operations being accessible via a network (e.g., the Internet) and via one or more appropriate interfaces (e.g., an API). In certain embodiments, for example, a client device may relay or operate in communication with cloud computing systems and may access circuit design information in a cloud environment.

The performance of certain of the operations may be distributed among the processors, not only residing within a single machine 1200, but deployed across a number of machines 1200. In some embodiments, the processors 1210 or processor-implemented modules are located in a single geographic location (e.g., within a home environment, an office environment, or a server farm). In some other embodiments, the processors or processor-implemented modules are distributed across a number of geographic locations.

Figure 12:
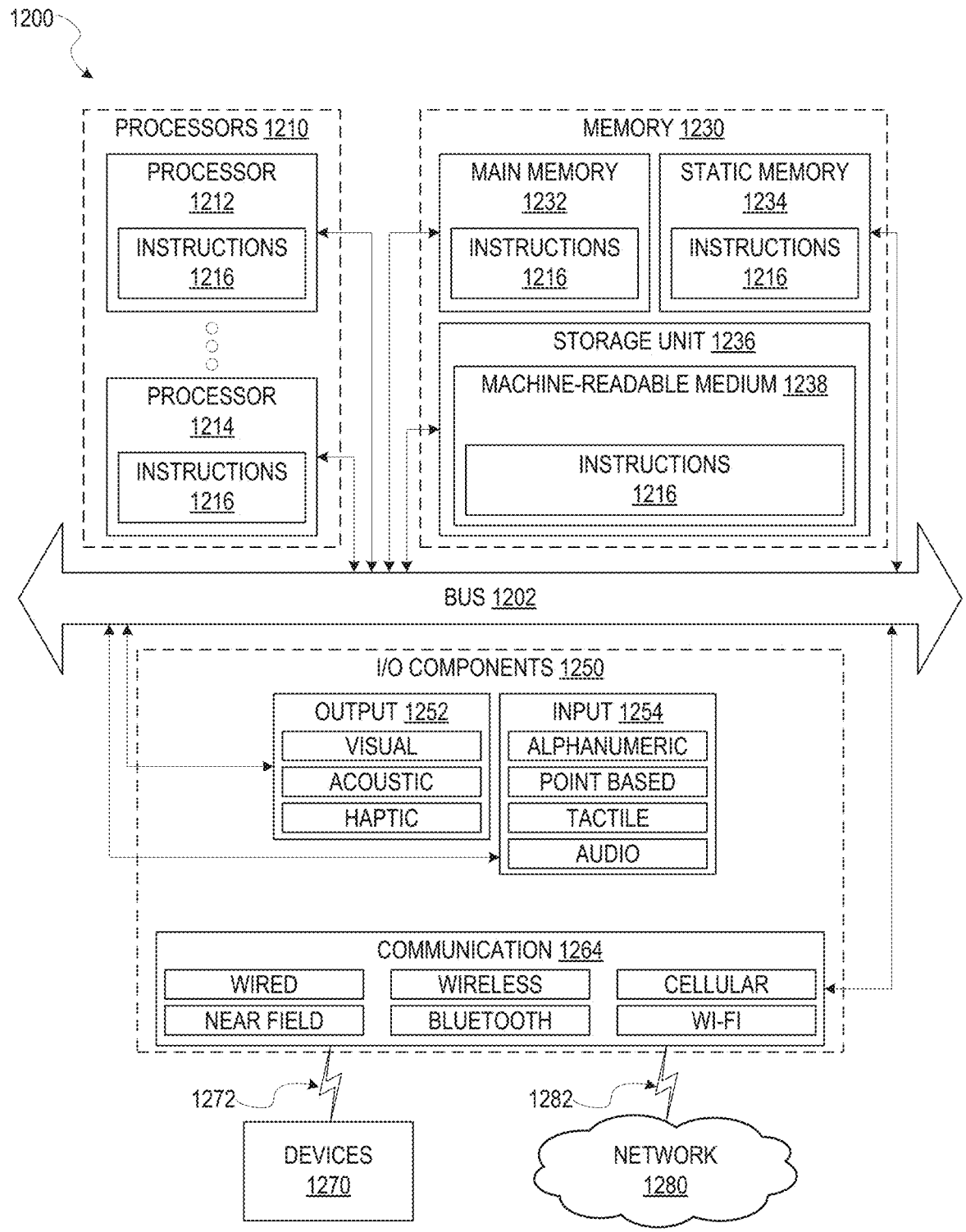
FIG. 12 is a diagram representing a machine in the form of a computer system within which a set of instructions are executed, causing the machine to perform any one or more of the methods discussed herein, according to some embodiments.

FIG. 12 is a diagrammatic representation of the machine 1200 in the form of a computer system within which a set of instructions may be executed for causing the machine 1200 to perform any one or more of the methodologies discussed herein, according to some embodiments. FIG. 12 shows components of the machine 1200, which is, according to some embodiments, able to read instructions from a machine-readable medium (e.g., a machine-readable storage medium) and perform any one or more of the methodologies discussed herein. Specifically, FIG. 12 shows a diagrammatic representation of the machine 1200 in the example form of a computer system, within which instructions 1216 (e.g., software, a program, an application, an applet, an app, or other executable code) for causing the machine 1200 to perform any one or more of the methodologies discussed herein can be executed. In alternative embodiments, the machine 1200 operates as a standalone device or can be coupled (e.g., networked) to other machines. In a networked deployment, the machine 1200 may operate in the capacity of a server machine or a client machine in a server-client network environment, or as a peer machine in a peer-to-peer (or distributed) network environment. The machine 1200 can comprise, but not be limited to, a server computer, a client computer, a personal computer (PC), a tablet computer, a laptop computer, a netbook, or any machine capable of executing the instructions 1216, sequentially or otherwise, that specify actions to be taken by the machine 1200. Further, while only a single machine 1200 is illustrated, the term "machine" shall also be taken to include a collection of machines 1200 that individually or jointly execute the instructions 1216 to perform any one or more of the methodologies discussed herein.

In various embodiments, the machine 1200 comprises processors 1210, memory 1230, and I/O components 1250, which can be configured to communicate with each other via a bus 1202. In some embodiments, the processors 1210 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another, or any suitable combination thereof) include, for example, a processor 1212 and a processor 1214 that may execute the instructions 1216. The term "processor" is intended to include multi-core processors 1210 that may comprise two or more independent processors 1212, 1214 (also referred to as "cores") that can execute the instructions 1216 contemporaneously. Although FIG. 12 shows multiple processors 1210, the machine 1200 may include a single processor 1212 with a single core, a single processor 1212 with multiple cores (e.g., a multi-core processor 1212), multiple processors 1210 with a single core, multiple processors 1210 with multiple cores, or any combination thereof.

The memory 1230 comprises a main memory 1232, a static memory 1234, and a storage unit 1236 accessible to the processors 1210 via the bus 1202, according to some embodiments. The storage unit 1236 can include a machine-readable medium 1238 on which are stored the instructions 1216 embodying any one or more of the methodologies or functions described herein. The instructions 1216 can also reside, completely or at least partially, within the main memory 1232, within the static memory 1234, within at least one of the processors 1210 (e.g., within the processor's cache memory), or any suitable combination thereof, during execution thereof by the machine 1200. Accordingly, in various embodiments, the main memory 1232, the static memory 1234, and the processors 1210 are considered machine-readable media 1238.

As used herein, the term "memory" refers to a machine-readable medium 1238 able to store data temporarily or permanently and may be taken to include, but not be limited to, random-access memory (RAM), read-only memory (ROM), buffer memory, flash memory, and cache memory. While the machine-readable medium 1238 is shown, in some embodiments, to be a single medium, the term "machine-readable medium" should be taken to include a single medium or multiple media (e.g., a centralized or distributed database, or associated caches and servers) able to store the instructions 1216. The term "machine-readable medium" shall also be taken to include any medium, or combination of multiple media, that is capable of storing instructions (e.g., the instructions 1216) for execution by a machine (e.g., the machine 1200), such that the instructions, when executed by one or more processors of the machine (e.g., the processors 1210), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 1250 include a wide variety of components to receive input, provide output, produce output, transmit information, exchange information, capture measurements, and so on. In general, it will be appreciated that the I/O components 1250 can include many other components that are not shown in FIG. 12. The I/O components 1250 are grouped according to functionality merely for simplifying the following discussion, and the grouping is in no way limiting. In various embodiments, the I/O components 1250 include output components 1252 and input components 1254. The output components 1252 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 1254 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. As described herein, "constraints," "requirements," "design elements," and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 1250 may include communication components 1264 operable to couple the machine 1200 to a network 1280 or devices 1270 via a coupling 1282 and a coupling 1272, respectively. For example, the communication components 1264 include a network interface component or another suitable device to interface with the network 1280. In further examples, the communication components 1264 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 1270 may be another machine or any of a wide variety of peripheral devices (e.g., a peripheral device coupled via a USB).

In various embodiments, one or more portions of the network 1280 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 1280 or a portion of the network 1280 may include a wireless or cellular network, and the coupling 1282 may be a Code Division Multiple Access (CDMA) connection, a Global System for Mobile communications (GSM) connection, or another type of cellular or wireless coupling.

Furthermore, the machine-readable medium 1238 is non-transitory (in other words, not having any transitory signals) in that it does not embody a propagating signal. However, labeling the machine-readable medium 1238 "non-transitory" should not be construed to mean that the machine-readable medium 1238 is incapable of movement; the machine-readable medium 1238 should be considered as being transportable from one physical location to another. Additionally, since the machine-readable medium 1238 is tangible, the machine-readable medium 1238 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to some embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A device comprising:
   a memory storing instructions; and
   a hardware processor communicatively coupled to the memory and configured by the instructions to perform operations comprising:
   causing an initial routing process to be performed on a circuit design to generate a routed circuit design;
   causing layer assignment to be performed on a set of routed networks of the routed circuit design to generate a set of layer-assigned networks;
   generating a set of via counts that corresponds to a set of grid cells for the circuit design by determining a count of vias in each grid cell of the set of grid cells that are associated with an individual layer-assigned network in the set of layer-assigned networks, the determining the count of vias in each grid cell of the set of grid cells comprising for each individual wire segment of the individual layer-assigned network;
   determining whether the individual wire segment is disposed on a select layer that is lower or higher than a preferred layer of the circuit design; and
   in response to determining that the individual wire segment is disposed on the select layer that is lower or higher than the preferred layer;
   determining a number of vias associated with the individual wire segment on the select layer; and
   adding the number of vias to a select count of vias for a select grid cell, on the select layer, containing the wire segment;
   determining a set of demand values that corresponds to the set of grid cells based on the set of via counts;
   generating congestion map data for the circuit design based on the set of demand values, the congestion map data describing routing congestion for the set of grid cells; and
   routing a network of the circuit design based on the congestion map data.

2. The device of claim 1, wherein the set of grid cells comprises grid cells for a plurality of layers of the circuit design.

3. The device of claim 1, wherein the generating the congestion map data for the circuit design based on the set of demand values comprises:
   accessing prior congestion map data for the set of grid cells; and
   generating the congestion map data by updating the prior congestion map data based on the set of demand values.

4. The device of claim 3, wherein the prior congestion map data comprises data describing a set of existing demand values previously determined for the set of grid cells; and
   wherein the updating the prior congestion map data based on the set of demand values comprises:
   adding a value, based on a given demand value in the set of demand values, to a given existing demand value in the set of existing demand values to generate an updated demand value for a given grid cell in the set of grid cells, the given demand value and the given existing demand value being associated with the given grid cell.

5. The device of claim 1, wherein the operations are performed as part of performing global routing on the network of the circuit design.

6. A non-transitory computer-readable medium comprising instructions that, when executed by a hardware processor of a device, cause the device to perform operations comprising:
   accessing circuit design data describing a set of layer-assigned networks of a circuit design, the circuit design data being generated by performing an initial routing process and a layer assignment process on the circuit design;
   generating a set of via counts that corresponds to a set of grid cells for the circuit design by determining a count of vias in each grid cell of the set of grid cells that are associated with an individual layer-assigned network in the set of layer-assigned networks, the determining the count of vias in each grid cell of the set of grid cells comprising, for each individual wire segment of the individual layer-assigned network:
      determining whether the individual wire segment is disposed on a select layer that is lower or higher than a preferred layer of the circuit design; and
      in response to determining that the individual wire segment is disposed on the select layer that is lower or higher than the preferred layer:
         determining a number of vias associated with the individual wire segment on the select layer; and
         adding the number of vias to a select count of vias for a select grid cell, on the select layer, containing the wire segment;
   determining a set of demand values that corresponds to the set of grid cells based on the set of via counts;
   generating congestion map data for the circuit design based on the set of demand values, the congestion map data describing routing congestion for the set of grid cells; and
   routing a network of the circuit design based on the congestion map data.

7. The non-transitory computer-readable medium of claim 6, wherein the operations further comprise:
   performing, by the hardware processor, layer assignment on a set of routed networks of the circuit design to generate the set of layer-assigned networks described by the circuit design data.

8. The non-transitory computer-readable medium of claim 6, wherein the set of grid cells comprises grid cells for a plurality of layers of the circuit design.

9. The non-transitory computer-readable medium of claim 6, wherein the generating the congestion map data for the circuit design based on the set of demand values comprises:
   accessing prior congestion map data for the set of grid cells; and
   generating the congestion map data by updating the prior congestion map data based on the set of demand values.

10. The non-transitory computer-readable medium of claim 9, wherein the prior congestion map data comprises data describing a set of existing demand values previously determined for the set of grid cells; and wherein the updating the prior congestion map data based on the set of demand values comprises:
   adding a value, based on a given demand value in the set of demand values, to a given existing demand value in the set of existing demand values to generate an updated demand value for a given grid cell in the set of grid cells, the given demand value and the given existing demand value being associated with the given grid cell.

11. The non-transitory computer-readable medium of claim 6, wherein the operations are performed as part of performing global routing on the network of the circuit design.

* * * * *